United States Patent
Shin et al.

(10) Patent No.: US 9,658,340 B2
(45) Date of Patent: May 23, 2017

(54) METHOD AND APPARATUS FOR MEASURING SYNTHETIC RECEPTION PATTERN OF ADAPTIVE ARRAY ANTENNA

(71) Applicant: ELECTRONICS AND TELECOMMUNICATIONS RESEARCH INSTITUTE, Daejeon (KR)

(72) Inventors: Dong Hoon Shin, Daejeon (KR); Woong Hee Kim, Changwon-si (KR); Jinchun Wang, Daejeon (KR); Dae Heon Lee, Daejeon (KR); Hae Yong Yang, Daejeon (KR); Inho Hwang, Daejeon (KR); Chun Soo Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 415 days.

(21) Appl. No.: 14/468,784

(22) Filed: Aug. 26, 2014

(65) Prior Publication Data

US 2015/0301185 A1    Oct. 22, 2015

(30) Foreign Application Priority Data

Oct. 29, 2013    (KR) .......................... 10-2013-0129055

(51) Int. Cl.
*G01S 19/23* (2010.01)
*G01S 7/40* (2006.01)
*G01S 19/21* (2010.01)
*G01R 29/10* (2006.01)

(52) U.S. Cl.
CPC .............. *G01S 19/23* (2013.01); *G01R 29/10* (2013.01); *G01S 19/21* (2013.01)

(58) Field of Classification Search
CPC .............................. G01S 19/23; G01S 19/235
USPC .... 342/25, 108, 145, 174, 189, 357.62, 369, 342/25 R
See application file for complete search history.

(56) References Cited

FOREIGN PATENT DOCUMENTS

| KR | 10-2002-0080638 A | 10/2002 |
| KR | 10-2008-0081752 A | 9/2008 |
| KR | 10-1025308 B1 | 3/2011 |
| KR | 10-2010-0081590 A | 4/2011 |

*Primary Examiner* — Dao Phan
(74) *Attorney, Agent, or Firm* — LRK Patent Law Firm

(57) ABSTRACT

A method and apparatus for measuring the synthetic reception pattern of an adaptive array antenna, which are divided into a hardware apparatus and a measurement method. The hardware apparatus includes a wavefront simulator, a GNSS simulator, an external controller, a signal measurement unit, and a GNSS receiver. The measurement method using the hardware apparatus includes setting a direction of arrival of jamming and calculating a weight vector, fixing weight vectors at the calculated weight vector and collecting outputs of an array antenna system for all test signals, and displaying the collected data on a grid of a 2D plane. In accordance with the present invention, a weight vector calculated under a specific jamming situation is maintained for all test signals, so that the synthetic reception pattern of the array antenna system can be measured.

12 Claims, 6 Drawing Sheets

METHOD AND APPARATUS FOR MEASURING SYNTHETIC RECEPTION PATTERN OF ADAPTIVE ARRAY ANTENNA

CROSS REFERENCE TO RELATED APPLICATION

This application claims the benefit of Korean Patent Application No. 10-2013-0129055, filed on Oct. 29, 2013, which is hereby incorporated by reference in its entirety into this application.

BACKGROUND OF THE INVENTION

1. Technical Field

The present invention relates generally to a method and apparatus for measuring the synthetic reception pattern of an adaptive array antenna and, more particularly, to a method and apparatus that measure and evaluate information about a null depth, a null width, and a satellite blind ratio, which are the principal performance indices of an adaptive array antenna system, for respective component steps (antenna elements, radio frequency (RF) module, and signal processing module) of the array antenna system in anti jamming nulling technology using an array antenna which is one of effective methods for protecting a Global Navigation Satellite System (GNSS) receiver from GNSS interference signals.

2. Description of the Related Art

A Global Navigation Satellite System (GNSS), of which a Global Positioning System (GPS) is representative, denotes a satellite-based navigation system for receiving information about the location, time, and additional error correction elements of a satellite from the satellite, and acquiring the exact time and location information of a user. Currently, a GNSS is being variously utilized in ground, maritime, and air systems in both military and civil domains.

Since a GNSS satellite transmits a low power signal from a remote place located at a distance of 20,000 km or more, power received by a receiver is as weak as $10^{-16}$ W. Therefore, a GNSS system is inevitably inherently vulnerable to unintentional electromagnetic interference such as multi-path interference, or intentional electromagnetic jamming. If the GNSS, which is variously utilized as the core of social infrastructures such as various types of communication, broadcasting, financial and logistics applications, is jammed, it is expected that a serious problem causing social disorder would occur.

In this way, various types of technologies have been used to cope with jamming or radio interference that becomes a serious threat to the GNSS. Among these technologies, spatial filtering technology (referred to as "nulling") using an array antenna is widely known as the most effective anti-jamming method. Here, nulling technology uses a principle in which multiple antennas are spatially arranged, and in which a signal is increased in a desired direction and an undesirable jamming signal is decreased by using a method of multiplying complex weights (or weight vectors) by the respective outputs of the antennas. Methods of implementing the same principle may be divided into an analog type and a digital type.

Recently, a digital array antenna system has been widely used in which signals received from antenna elements are converted into Intermediate Frequency (IF) signals via a down-converter, the IF signals are converted into digital signals at low frequency, and then anti jamming signal processing is performed on the digital signals via a digital signal processor with an adaptive nulling algorithm.

The performance indices of the anti jamming system using an adaptive array antenna may be chiefly divided into ① null depth, ② null width, and ③ satellite blind ratio; all of which can be obtained from the synthetic reception pattern of the array antenna. A brief description of the individual performance indices is made as follows.

① Null depth—index indicating the decrease in an undesired jamming signal, which is obtained via adaptive nulling processing.

② Null width—index indicating the degree of attenuation of signals around a jamming direction caused by the side effect of adaptive filtering. This index is evaluated as the beamwidth at which signal intensity relative to an omni-directional antenna is reduced to ½ (−3 dB in power unit).

③ Satellite blind ratio—index indicating the reduction ratio of the number of GNSS visible satellites occurring when adaptive nulling processing is applied. This index indicates the ratio of the size of a satellite signal receivable area upon using an adaptive array antenna to the size of a satellite signal receivable area upon using an omni-directional antenna, and varies according to the performance of a receiver used.

However, since the above three performance indices of the adaptive array antenna system adaptively vary with the number, intensity, direction, and signal type of jamming signals, it is impossible to exactly measure such performance indices using traditional performance measurement methods related to an existing fixed reception pattern antenna (FRPA).

In outdoor test facilities having well-calibrated characteristics, some parameters may be measured, but there is a disadvantage in that tests preparation and calibration are time-consuming, and it is difficult to secure repeatability which is a precondition to the evaluation of performance. Further, in order to solve the problem of repeatability, measurement may be conducted in an anechoic chamber, but a problem arises in that an expensive multi-channel satellite simulator must be provided, and a lot of measurement time is required.

Therefore, there is required an injection test method using a simulator capable of reducing cost and measurement effort while securing repeatability.

As related preceding technology, Korean Patent Application Publication No. 10-2010-0081590 (entitled "Wavefront simulator for testing GPS adaptive array antenna") discloses technology for randomly generating the wavefront of a GPS jamming signal incident on an array antenna so that performance can be evaluated in a laboratory other than an anechoic chamber and an outdoor test facility.

The invention disclosed in Korean Patent Application Publication No. 10-2010-0081590 is disadvantageous in that it is impossible to measure the synthetic reception pattern of an array antenna system, and thus only a null depth in a specific jamming direction can be detected, and additional performance indices such as a null width and a satellite blind ratio cannot be evaluated.

Further, the invention disclosed in Korean Patent Application Publication No. 10-2010-0081590 cannot evaluate the above performance indices for each of antenna elements, an RF module, and a signal processing module constituting the array antenna system. The evaluation of performance for each step of the components is very important to the analysis of limits and limiting factors for the entire system performance upon developing an anti jamming array antenna system.

SUMMARY OF THE INVENTION

Accordingly, the present invention has been made keeping in mind the above problems occurring in the prior art, and an object of the present invention is to provide a measurement method and apparatus that can evaluate the null depth, null width, and satellite blind ratio of an adaptive array antenna system with high repeatability without requiring additional hardware, compared to conventional methods proposed in preceding patents.

In particular, the present invention can measure synthetic reception patterns for respective component steps constituting the array antenna system by using only the proposed measurement method and apparatus, and thus the influence of each of an antenna element, an RF module, and a digital signal processing module on performance indices can be analyzed.

In accordance with an aspect of the present invention to accomplish the above object, there is provided an apparatus for measuring a synthetic reception pattern of an adaptive array antenna, including a wavefront simulator for simulating directions of arrival (DoA) of a jamming signal and test signals using phase differences between outputs of multiple antenna elements, and outputting multiple signals in which signals corresponding to the phase differences and a GNSS satellite signal are combined; an external controller for sequentially controlling operations of the wavefront simulator and a signal processing module of an array antenna system, receiving the direction of arrival of the jamming signal from a user, and calculating phase differences between the outputs of the antenna elements depending on an antenna array geometry; a GNSS simulator for simulating the GNSS satellite signal; a signal measurement unit for measuring output of the array antenna system; and a GNSS receiver for checking quality of reception of the GNSS satellite signal.

In summary, the present invention is configured to test the array antenna system in an indoor environment by injecting signals being simulating the array antenna outputs into the input port of an RF module.

The wavefront simulator may generate an Intermediate Frequency (IF) signal for digital signal processing, as well as a GNSS RF signal. Therefore, an injection test may be performed on the signal processing module alone without requiring an RF module or additional test equipment.

The performance of an entire system including antenna elements, the RF module, and the signal processing module can be measured, upon incorporating actually measured gains and phases of respective antenna elements of the array antenna into the wavefront simulator. Therefore, targets to be tested may be freely configured, so that the influences of respective components on the performance of the entire system may be analyzed via measurements at respective component steps.

The external controller may fix weight vectors for all test signals at a certain weight vector, calculated under a specific jamming situation.

The external controller may cause a signal processing module of the array antenna system in the non jamming situation to bypass one of the outputs of the antenna elements without applying an adaptive nulling algorithm.

In accordance with another aspect of the present invention to accomplish the above object, there is provided a method of measuring a synthetic reception pattern of an adaptive array antenna, including dividing a hemispheric surface into sections of a grid of a 2D plane defined by an azimuth angle and an elevation angle around a receiving antenna located on a ground; calculating, by an external controller, phase differences between outputs of antenna elements for a jamming signal and multiple test signals under a specific jamming situation, and then, based on the calculated phase differences, setting outputs of the wavefront simulator depending on directions of arrival of the jamming signal and the test signals; obtaining a weight vector under the specific jamming situation, and fixing subsequent weight vectors for all test signals at the obtained weight vector; measuring intensity of a synthetic signal, to which the weight vector is applied, using a signal measurement unit, and recording the measured intensity in a corresponding section of the grid; deactivating, by the external controller, the adaptive nulling algorithm under a non-jamming situation, measuring one of antenna outputs which is bypassed by using the signal measurement unit, and recording the measured intensity in a corresponding section of the grid; comparing two antenna reception patterns (an omni-directional antenna reception pattern and the synthetic reception pattern of the adaptive array antenna) acquired depending on whether jamming is present, and measuring a null depth, a null width, and a satellite blind ratio of the adaptive array antenna system in the jamming situation.

Measuring the performance indices may be configured to measure the null depth as a decrement in signal intensity appearing in a direction of arrival of a jamming signal in the adaptive array antenna pattern under the jamming situation to the omni-directional antenna pattern under the non jamming situation.

Measuring the performance indices may be configured to measure the null width as an angle of a beamwidth corresponding to a gain above a threshold near a null position.

Measuring the performance indices may be configured to evaluate the satellite blind ratio by calculating an averaged number of GNSS satellites included in the null width on a hemisphere on which the GNSS satellites are located.

Measuring the performance indices may be used to evaluate performance indices for respective components of the array antenna system.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
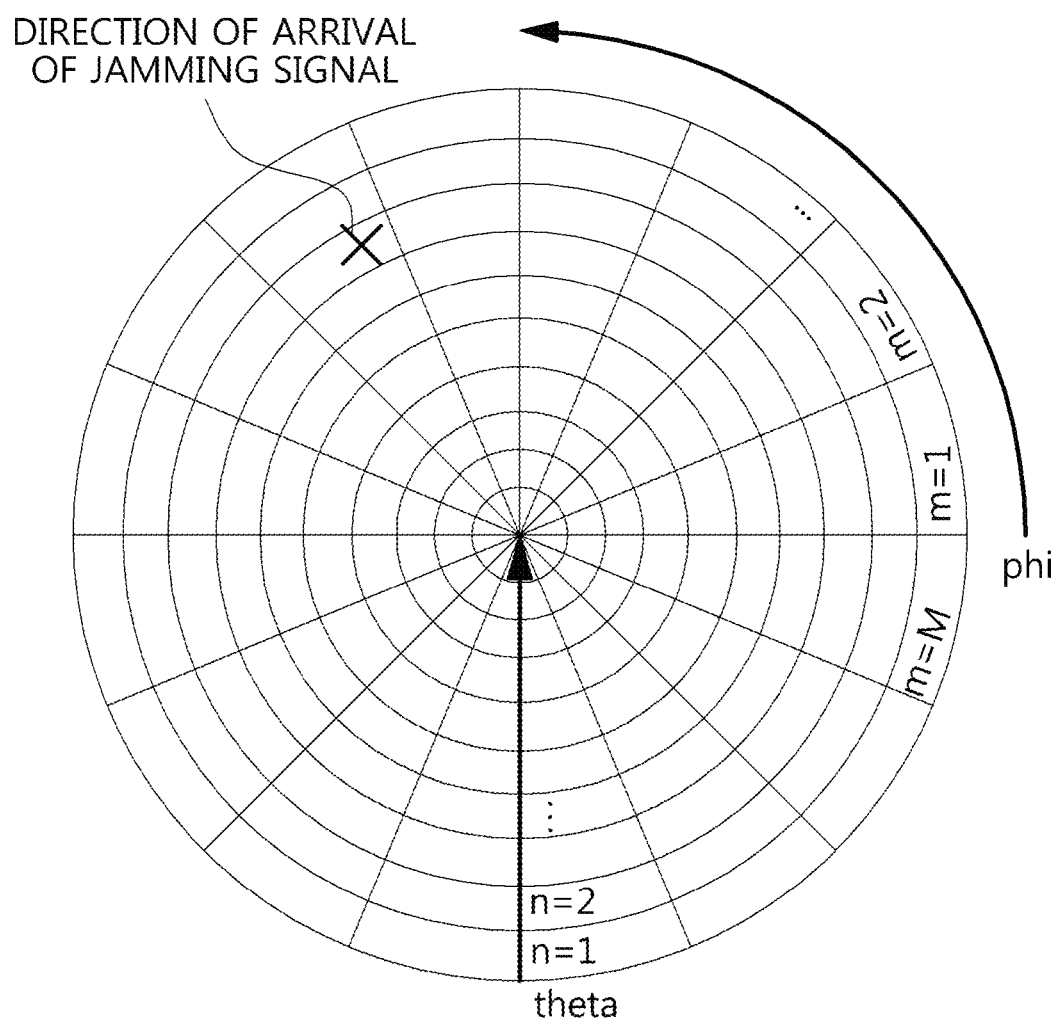
FIG. 1 is a diagram showing an example in which the direction of arrival of a jamming signal and the direction of arrival of test signals are set according to an embodiment of the present invention.

The present invention may be variously changed and may have various embodiments, and specific embodiments will be described in detail below with reference to the attached drawings.

However, it should be understood that those embodiments are not intended to limit the present invention to specific disclosure forms and they include all changes, equivalents or modifications included in the spirit and scope of the present invention.

The terms used in the present specification are merely used to describe specific embodiments and are not intended to limit the present invention. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains. The terms identical to those defined in generally used dictionaries should be interpreted as having meanings identical to contextual meanings of the related art, and are not interpreted as being ideal or excessively formal meanings unless they are definitely defined in the present specification.

Embodiments of the present invention will be described in detail with reference to the accompanying drawings. In the following description of the present invention, the same reference numerals are used to designate the same or similar elements throughout the drawings and repeated descriptions of the same components will be omitted.

The present invention relates to a method and apparatus for measuring a Global Positioning System (GPS) adaptive array antenna system, which is currently performed in an anechoic chamber or in an outdoor test facility. The present invention discloses technology extending from a conventional scheme which simulates only the Direction of Arrival (DoA) of a jamming signal and evaluates only the degree of reduction in the jamming signal, that is, a null depth, and the main feature of the present invention is to make improvements so as to acquire the synthetic reception pattern of an array antenna to which an adaptive nulling algorithm is applied in a specific jamming situation and to enable various performance indices, such as a null width and a satellite blind ratio, as well as a null depth, to be measured.

FIG. 1 is a diagram showing an example in which the direction of arrival of a jamming signal and the direction of arrival of test signals are set according to an embodiment of the present invention.

A hemispheric range, that is, the range of an angle of azimuth (phi) from 0 to 360° and an angle of elevation (theta) from 0 to 90°, around a receiving antenna located on a ground, is illustrated in the form of a two-dimensional (2D) plan view.

The range of the azimuth angle from 0 to 360° is equally divided into M sections, the range of the elevation angle (theta) from 0 to 90° is equally divided into N sections, and thus the 2D plane is represented by the sections of a grid.

The divided sections are allocated to the directions of arrival of a jamming signal or the directions of arrival of test signals. In FIG. 1, as a single example, when the range of the azimuth angle is equally divided into M (=16) sections, and the range of the elevation angle is equally divided into N (=10) sections, the direction of arrival of a jamming signal represented by X is mapped to "(m, n)=(6,3)."

For an electromagnetic wave incident on the array antenna in a specific direction, the respective outputs of array antenna elements exhibit specific phase differences that are correlated with each other. Therefore, even if there is no physical antenna, the output of the physical antenna may be simulated with signals having the above specific phase differences.

Therefore, for an electromagnetic signal incident in a specific direction, the output of the adaptive array antenna system may be measured without requiring a physical antenna.

For this, for "test signals" input in the directions of arrival designated as individual sections of the grid, system outputs must be respectively measured. However, the system outputs must be measured under a jamming situation. To that end, the direction of arrival of a specific jamming signal is specified, and an adaptive nulling algorithm is applied, so that a weight vector is calculated to minimize the jamming signal.

Thereafter, respective test signals corresponding to all directions (M*N directions) on the hemisphere mapped to the sections of the grid are applied, the outputs of the adaptive array antenna system for the respective test signals are measured, and the measured intensities of the outputs are recorded in the respective sections of the grid, thus drawing an antenna pattern.

The number of directions of arrival of the test signals is identical to the number of sections (M*N) of the grid. When a signal jammer is applied, one of the M*N directions of arrival of the test signals is identical to the direction of arrival of the jamming signal.

In summary, the direction of arrival of a jamming signal denotes a direction on which the jamming signal is incident, and, the weight vector of the system is calculated in the situation. The directions of arrival of test signals denote the individual sections of the grid to be simulated so as to obtain an antenna reception pattern in a jamming situation in which the weight vector has been determined.

Figure 2A:
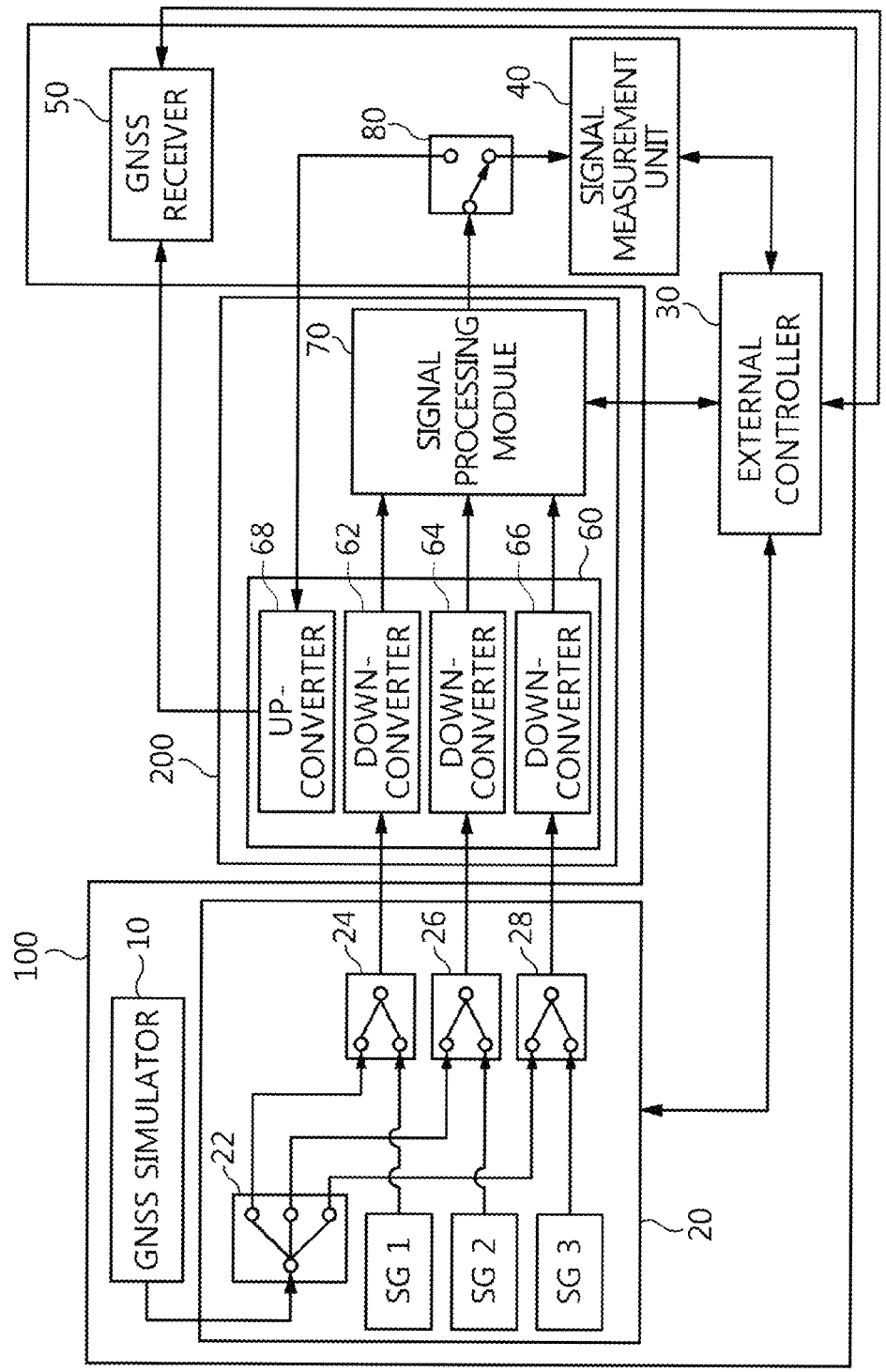
FIGS. 2A and 2B are configuration diagrams showing the connection of an apparatus for measuring the synthetic reception pattern of an adaptive array antenna according to an embodiment of the present invention to equipment to be tested.
Figure 2B:
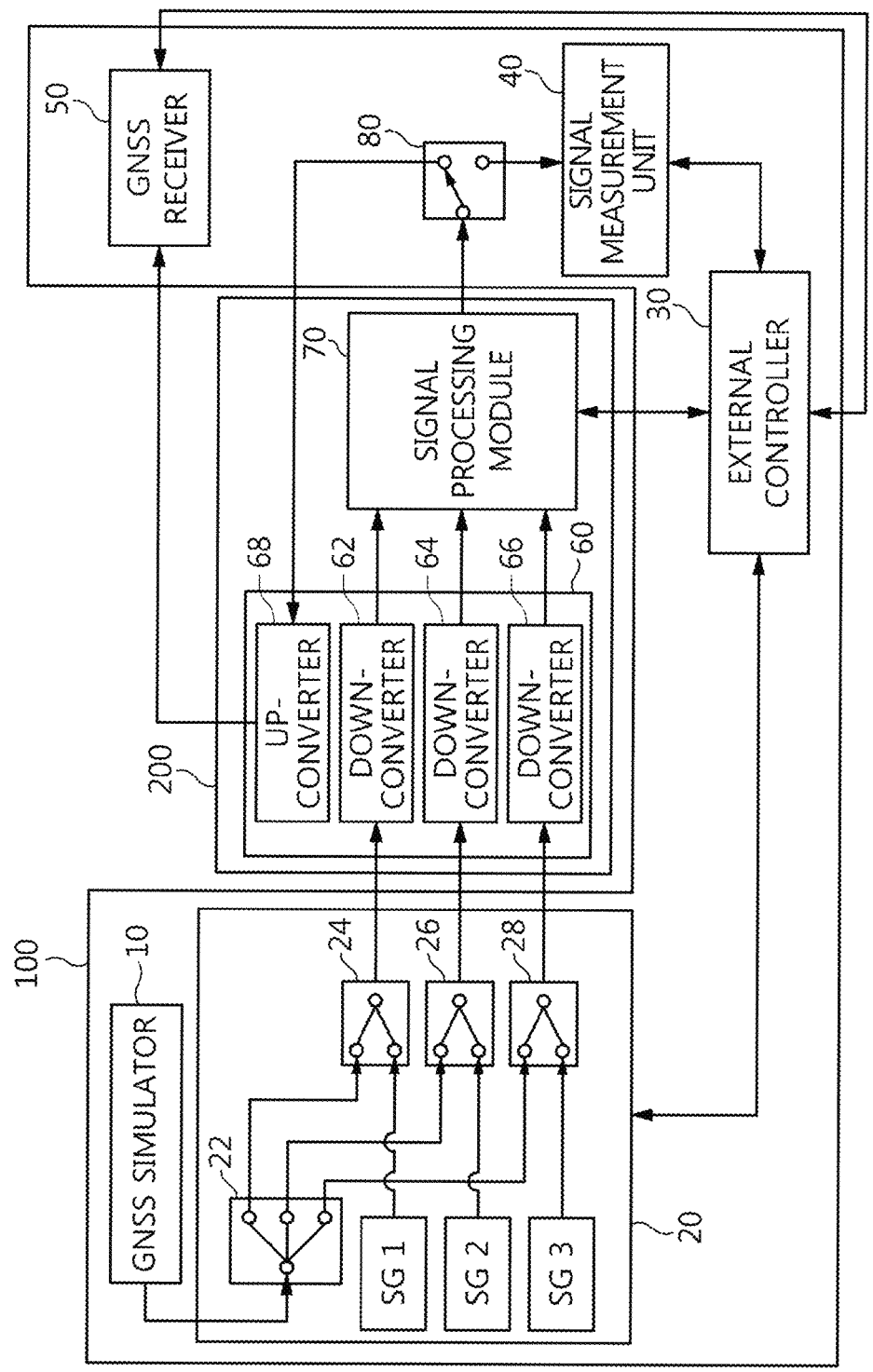

FIGS. 2A and 2B are configuration diagrams showing the configuration of an apparatus for measuring the synthetic reception pattern of an adaptive array antenna according to an embodiment of the present invention, and an array antenna system which is a target to be tested, and the state of mutual connection between the measurement apparatus and the array antenna system. For convenience of description, an example of a 3-element antenna system is assumed.

First, as shown in FIG. 2A, an apparatus 100 for measuring the synthetic reception pattern of an adaptive array antenna chiefly includes a wavefront simulator 20, a GNSS simulator 10, an external controller 30, a signal measuring device 40, and a GNSS receiver 50. An array antenna system 200 includes a RF module 60 and a signal processing module 70, and an array antenna is removed so as to perform an injection test.

The wavefront simulator 20 may simulate the directions of arrival of a jamming signal and test signals without requiring a physical array antenna by adjusting phase differences between the output signals of three antenna elements. The wavefront simulator 20 may conduct tests in an indoor environment by injecting a signal into the input terminal of the RF module 60 of the array antenna system 200 through a divider 22 and combiners 24, 26, and 28.

The signal processing module 70 calculates a weight vector for minimizing a jamming signal under a specific jamming situation using an adaptive nulling algorithm. If the signal measurement unit 40 measures the intensities of the output signals of the array antenna system 200 in all the directions of arrival of test signals including the jamming direction in the situation in which the weight vector is maintained, under the control of the external controller 30, the synthetic reception pattern of the adaptive array antenna in the jamming situation may be acquired.

Further, since the wavefront simulator 20 also generates Intermediate Frequency (IF) signals for digital signal processing, as well as GNSS RF signals, an injection test may be performed on the signal processing module 70 alone without requiring the RF module 60 or additional test equipment. Further, when the actually measured gains and phases of respective antenna elements constituting the array antenna are incorporated into the wavefront simulator 20, the performance of the entire system including the antenna elements, the RF module 60, and the signal processing module 70 can be measured. Therefore, targets to be tested are freely configured, so that the influence of the respective components on the performance indices of the entire system may be analyzed via measurements at respective component steps.

The wavefront simulator 20 may be implemented using various methods, and is not limited by a specific implementation method. The wavefront simulator 20 includes the divider 22 and the combiners 24, 26, and 28 so that a GNSS satellite signal can be simulated via the respective outputs of the wavefront simulator 20.

The divider 22 of the wavefront simulator 20 may divide a GNSS satellite signal from the GNSS simulator 10 into three paths.

The combiners 24, 26, and 28 of the wavefront simulator 20 combine the output signals of respective signal generators SG1, SG2, and SG3 and the GNSS satellite signal of the GNSS simulator 10 and transmit respective resulting signals to the array antenna system 200 as the output signals of the wavefront simulator 20. That is, the combiner 24 combines the output signal of the signal generator SG1 and the GNSS satellite signal and generates the simulated output signal of the first antenna element. Similarly, the combiner 26 combines the output signal of the signal generator SG2 and the GNSS satellite signal, and generates the simulated output signal of the second antenna element. The combiner 28 combines the output signal of the signal generator SG3 and the GNSS satellite signal, and generates the simulated output signal of the third antenna element.

Differences between the output signals of the three signal generators SG1, SG2, and SG3 are designated to satisfy the relationship of phase differences in accordance with the direction of arrival of a jamming signal (or test signals) to be simulated.

In other words, the wavefront simulator 20 may generate the phase differences between the outputs of antenna elements depending on the antenna array geometry and any direction of arrival of a signal so that the wavefront simulator can be used in the laboratory without requiring any physical antenna.

Meanwhile, if necessary, the GNSS simulator 10 may be included in the wavefront simulator 20.

The external controller 30 sequentially controls the operations of the wavefront simulator 20 and the signal processing module 70 of the array antenna system 200. Further, the external controller 30 calculates the phase differences between the outputs of the antenna elements depending on the antenna array geometry and the direction of arrival of a jamming signal defined by a user.

The phase information between the antenna element outputs, calculated by the external controller 30, is used in the wavefront simulator 20 to generate relative phase differences between channels.

Meanwhile, the array antenna system 200 to be tested is generally composed of antenna elements, the RF module 60, and the signal processing module 70, but, in the embodiment of the present invention, the antenna elements are omitted for an injection test in the drawing.

The RF module 60 includes multiple down-converters 62, 64, and 66 for converting the output signals of the wavefront simulator 20 into IF signals so that signal processing can be performed by the signal processing module 70 after digital conversion, and a up-convertor 68 for converting the IF signal output from the signal processing module 70 into a GNSS RF signal.

The signal processing module 70 converts multiple IF signals, which are outputs of the RF module 60, into digital signals through respective Analog-to-Digital Converters (ADCs), to combine three digital signals using an adaptive nulling algorithm installed therein or to bypass one of three signals in compliance with an instruction from the external controller 30, and to convert the digital signal into an analog IF signal through a Digital-to-Analog Converter (DAC).

In FIG. 2A, the signal measurement unit 40 measures the signal intensity of the IF output of the signal processing module 70 received through the switch 80. Similar to the wavefront simulator 20, the scope of the signal measurement unit 40 for measuring signal intensity is not limited to a spectrum analyzer.

The configuration of FIG. 2B is similar to that of FIG. 2A, but there is a difference in the connection state of the switch 80. In FIG. 2A, the switch 80 connects the signal processing module 70 and the signal measurement unit 40, but, in FIG. 2B, the switch 80 connects the signal processing module 70 and the up-converter 68. The IF output signal of the signal processing module 70 may be input to a GNSS receiver 50 through the up-converter 68 of the RF module 60 and may then be used to measure the quality of reception of a GNSS satellite.

Figure 3:
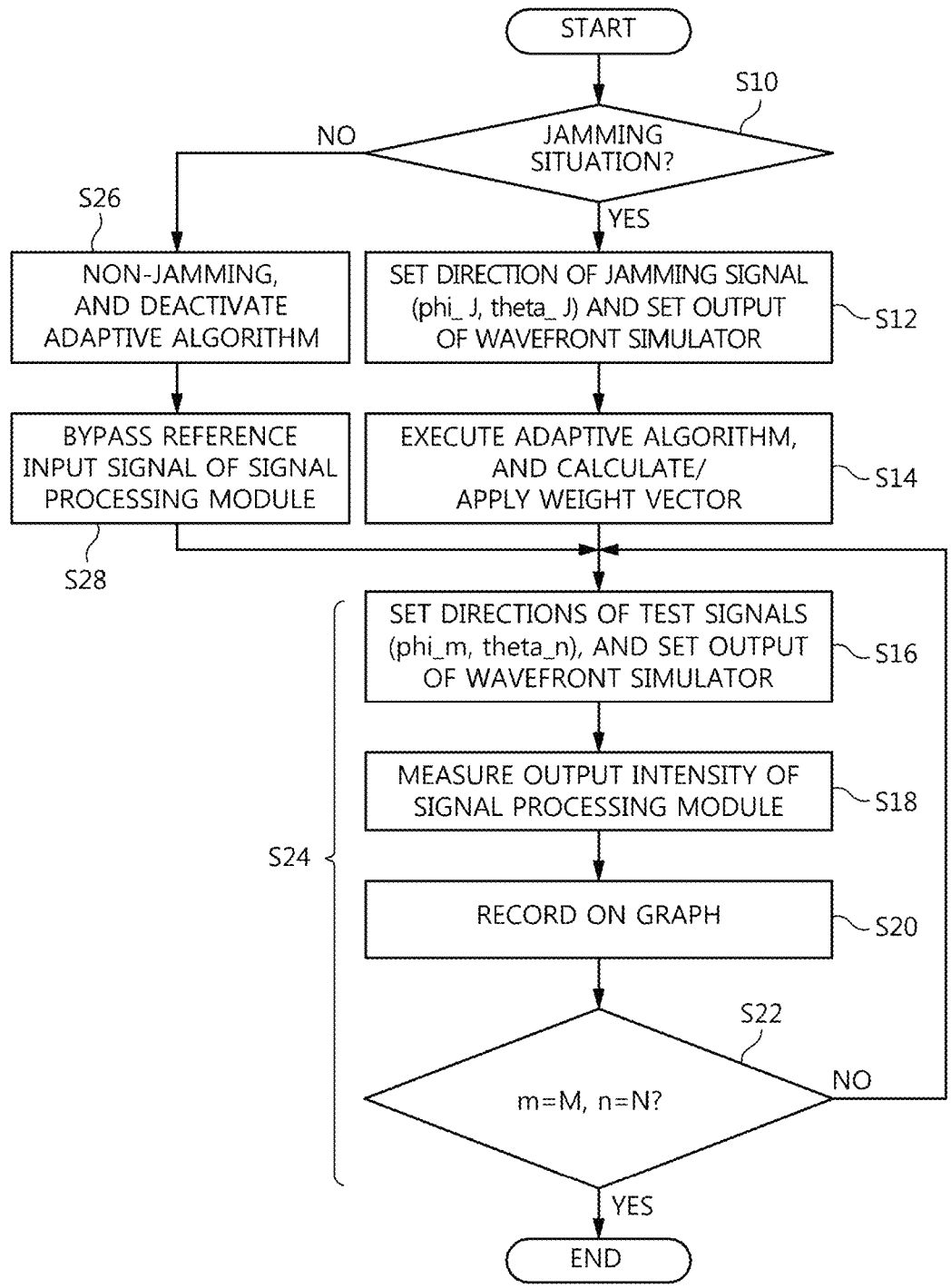
FIG. 3 is a flowchart showing a method of measuring the synthetic reception pattern of an adaptive array antenna according to an embodiment of the present invention.

FIG. 3 is a flowchart showing a method of measuring the synthetic reception pattern of an adaptive array antenna according to an embodiment of the present invention.

In order to evaluate performance indices (a null depth, a null width, and a satellite blind ratio) under a specific jamming situation, the following two reception patterns are needed.

① Synthetic reception pattern of the adaptive array antenna under a specific jamming situation ② General reception pattern (omni-directional pattern of the single antenna) under a non jamming situation First, a procedure for acquiring the synthetic reception pattern of the adaptive array antenna under a specific jamming situation will be described. Under the specified jamming situation (Yes at step S10), the external controller 30 calculates relationships between the gains and phases of the antenna outputs of the array antenna for the direction of arrival of a jamming signal (phi_J, theta_J) input by a user, as indicated by X in FIG. 1, and thus sets the outputs of the wavefront simulator 20 at step S12.

The signal processing module 70 calculates a weight vector by applying an adaptive nulling algorithm to the jamming situation, and the external controller 30 fixes weight vectors at the calculated weight vector by controlling the signal processing module 70 at step S14.

The reason for fixing the weight vectors is as follows. A weight vector typically generated by the adaptive nulling algorithm varies adaptively with the intensity, frequency, direction of arrival of a jamming signal. If the adaptive nulling algorithm is applied to the specific jamming situation, the signal processing module 70 calculates a weight vector so that the intensity of the jamming signal is minimized. If the external controller 30 does not command the signal processing module 70 to fix the weight vector, the adaptive nulling algorithm is continuously applied even to individual test signals, and new weight vectors are calculated for the respective test signals.

Since the present invention is intended to measure antenna reception patterns when an algorithm for a specific jamming signal is applied to minimize it, the exact antenna reception patterns cannot be obtained if weight vectors are newly calculated even for test signals as well as for a jamming signal.

Therefore, in order to obtain antenna reception patterns exactly, a weight vector for the direction of arrival of the jamming signal is obtained first, and thereafter the weight vectors for the directions of arrival of the test signals indicating the respective sections of the grid are fixed at the calculated weight vector. Then, the test signals must be injected into the system and the outputs of the system must be measured.

The external controller 30 does not notify the signal processing module 70 of information about the direction of arrival of the jamming signal (for example, the values of m and n) set by the user. However, the external controller 30 transfers only the command related to applying the adaptive nulling algorithm to the signal processing module 70.

Thereafter, the external controller 30 sets the output of the wavefront simulator 20 for the directions of arrival of test signals defined by the azimuth angle (phi_m) and the elevation angle (theta_n) (where m=1 and n=1) at step S16. The signal measurement unit 40 measures the intensity of a synthetic signal to which the weight vector determined at step S14 is applied (that is, a synthetic signal in which three signals to which the weight vector is applied are synthesized by the signal processing module 70) at step S18, and the external controller 30 records the measured intensity in the corresponding section of the grid at step S20.

Next, it is judeged whether the above procedure has been completed for the directions of arrival of all test signals set (1≤m≤M, 1≤n≤N) in the external controller 30 at step S22.

In the case where the above procedure has not yet been finished on the directions of arrival of all test signals (1≤m≤M, 1≤n≤N), if the above procedure is repeated for the directions of arrival of all test signals set in the external controller 30 (1≤m≤M, 1≤n≤N) at step S24, the synthetic reception pattern of the array antenna system under the jamming situation proposed in the present invention is achieved.

Next, a procedure for acquiring a single antenna reception pattern in a non-jamming situation will be described.

In a situation in which jamming is not present, the external controller 30 commands the signal processing module 70 to bypass the adaptive nulling algorithm at step S26.

Alternatively, the external controller 30 performs control so that any one input channel is selected from among multiple input channels to the signal processing module 70 and passed through without applying the adaptive nulling algorithm at step S28.

Thereafter, if step S24 is performed, a reception pattern for one of the array antenna elements can be obtained.

In general, the respective output characteristics of the plurality of antenna elements are almost identical. The external controller 30 compares the obtained reception pattern with the previously obtained synthetic reception pattern, and is then capable of measuring the null depth, null width, and satellite blind ratio of the array antenna system. Of course, if necessary, instead of the external controller 30, the user may personally compare the synthetic reception pattern of the adaptive array antenna with the single antenna reception pattern, and obtain the null depth, null width, and satellite blind ratio of the array antenna system.

Figure 4:
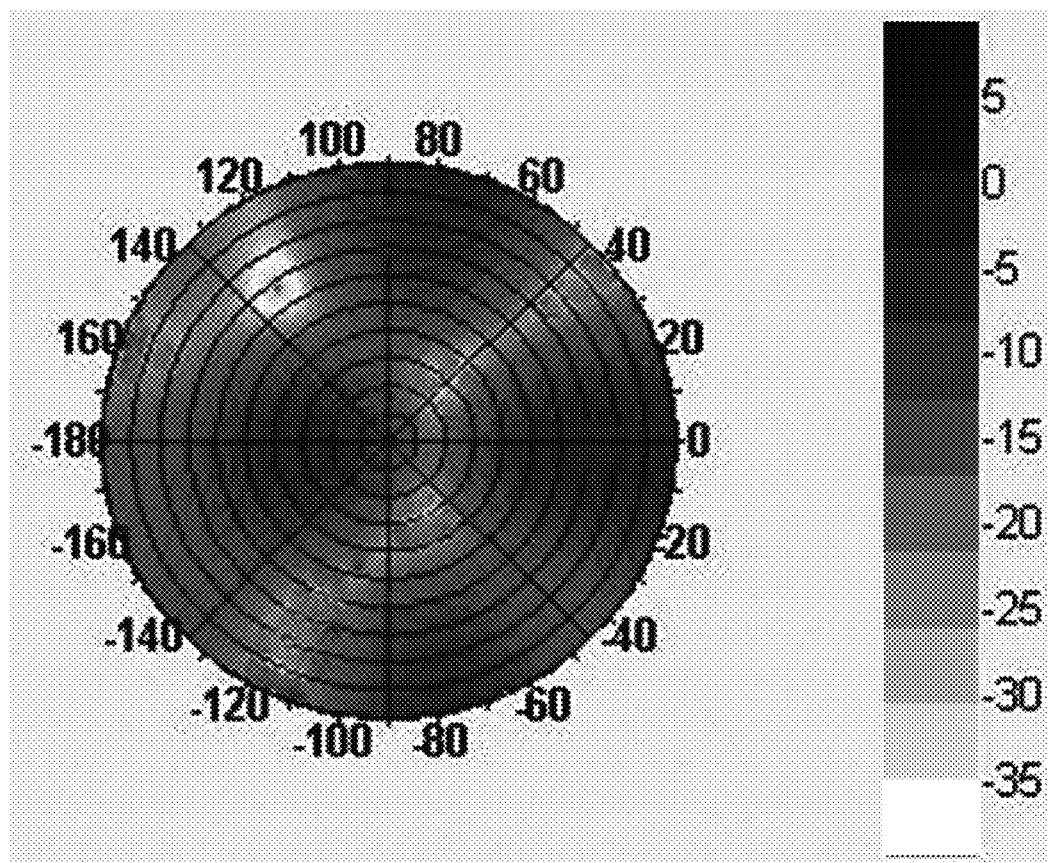
FIG. 4 is a graph showing the measured synthetic reception pattern of an adaptive array antenna according to an embodiment of the present invention.

FIG. 4 illustrates the measured synthetic reception pattern of an adaptive array antenna under a specific jamming situation according to an embodiment of the present invention. A dark area denotes a direction with high gain, and a bright spot denotes a direction with low gain. Therefore, it can be seen that a null is formed in the direction of arrival of a jamming signal indicated by X in FIG. 1, and then the jamming signal is decreased.

Meanwhile, the present invention acquires the synthetic reception pattern of the array antenna under the specific jamming situation and the single antenna reception pattern in the non jamming situation, based on the flowchart of the measurement method shown in FIG. 3. Performance indices, such as a null depth, a null width, and a satellite blind ratio, may be evaluated by comparing the two reception patterns with each other.

For example, the null depth may be evaluated as a decrement in signal intensity appearing in the direction of arrival of a jamming signal under a jamming situation to a non jamming situation by comparing two reception patterns.

Meanwhile, from the standpoint of the GNSS receiver 50, even if a jamming situation occurs and a null is formed in the jamming direction to decrease the intensity of the jamming signal, a problem may arise in the reception of a GPS satellite signal in a certain direction if a reception pattern around the null is hollowed. Therefore, the null width is obtained by measuring the angle of a beamwidth corresponding to a gain above a threshold near the null in the synthetic reception pattern.

Meanwhile, the satellite blind ratio is evaluated by calculating the averaged number of satellites included in the measured null width on the hemisphere. That is, the satellite blind ratio may be evaluated by calculating the total number of satellites seen in the hemisphere in a non jamming situation and the number of satellites corresponding to the area where satellite signals cannot be received due to a null in the presence of jamming.

Figure 5:
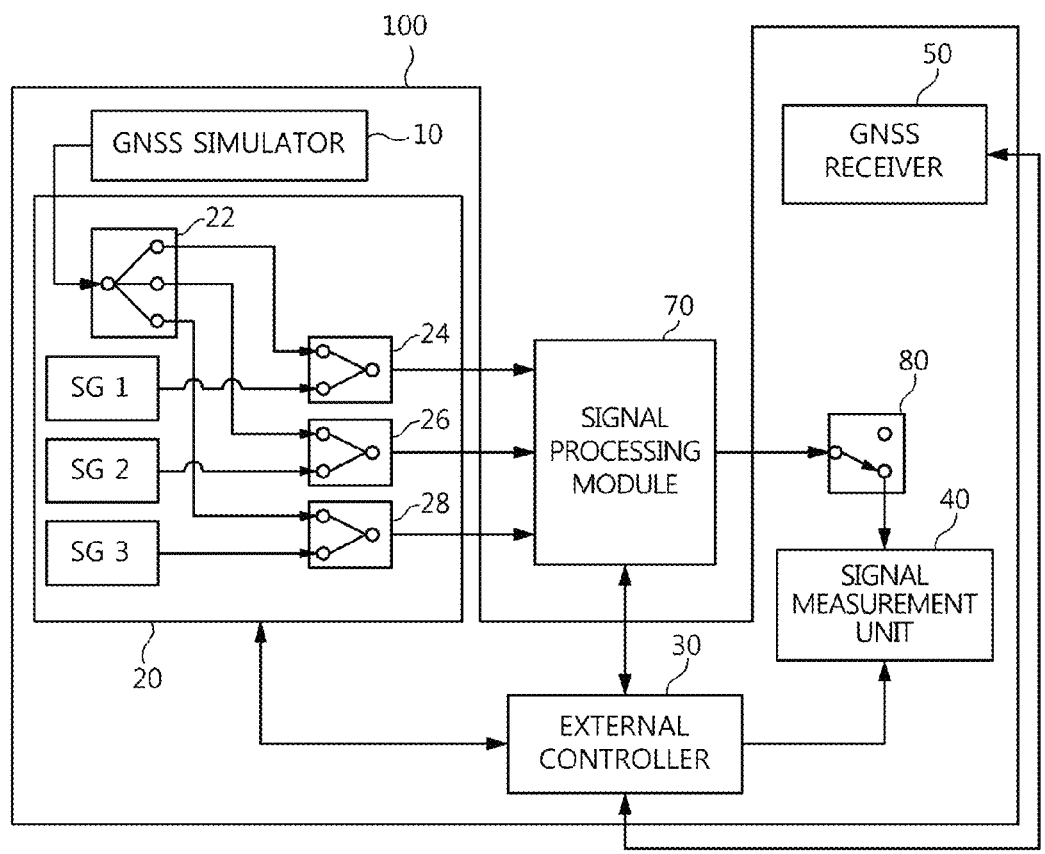
FIG. 5 is a configuration diagram showing the connection of the apparatus for measuring the synthetic reception pattern of a signal processing module according to an embodiment of the present invention.

FIG. 5 is a configuration diagram showing the connection of the apparatus 100 for measuring the synthetic reception pattern of the signal processing module 70 according to an embodiment of the present invention.

The wavefront simulator 20 may also generate IF signals that is converted into digital signals by the signal processing module 70. Therefore, a synthetic reception pattern may be acquired via an injection test performed on the signal processing module 70 alone without requiring a downconverter, and three performance indices (null depth, null width, and satellite blind ratio) for the signal processing module 70 can be measured by means of the synthetic reception pattern.

When an RF module 60 is added to the configuration diagram of FIG. 5, a configuration identical to that of FIG. 2A is obtained, and the performance indices of only the RF module 60 may be derived by comparing synthetic reception patterns measured in the configurations of FIG. 2A and FIG. 5 with each other.

Further, if the characteristics (gains and phases) of the antenna elements of the array antenna are acquired by electromagnetic wave simulation tool or actual measurement and are incorporated into the wavefront simulator 20, and performance indices are measured in the test configuration of FIG. 2A, the performance indices of the entire system (the antenna elements, the RF module, and the signal processing module) may be obtained, and the performance indices of only the array antenna may be derived from the performance indices of the entire system.

Therefore, if targets to be tested are changed and measured for respective component steps of the array antenna system, the influence of the characteristics of the respective components on the performance indices of the entire system may be analyzed.

Accordingly, the present invention relates to a test method and apparatus for measuring the performance indices of an adaptive array antenna system, which can easily measure the performance indices, such as a null width and a satellite blind ratio as well as a null depth, for the jamming signal of the array antenna system to which an adaptive nulling algorithm is applied, in an indoor environment. Further, for respective component steps constituting the array antenna system, synthetic reception patterns may be measured and the respective influences thereof may be analyzed, without requiring additional test equipment. Therefore, the present invention may be variously utilized as test evaluation equipment for the anti jamming performance of a GNSS array antenna system.

As described above, optimal embodiments of the present invention have been disclosed in the drawings and the specification. Although specific terms have been used in the present specification, these are merely intended to describe the present invention and are not intended to limit the meanings thereof or the scope of the present invention described in the accompanying claims. Therefore, those skilled in the art will appreciate that various modifications and other equivalent embodiments are possible from the embodiments. Therefore, the technical scope of the present invention should be defined by the technical spirit of the claims.

What is claimed is:

1. A method of measuring a synthetic reception pattern of an adaptive array antenna, comprising:
    acquiring, by an external controller, a synthetic reception pattern of an adaptive array antenna under a specific jamming situation while operating in conjunction with a signal measurement unit;
    acquiring, by the external controller, a single antenna reception pattern in a non-jamming situation while operating in conjunction with the signal measurement unit; and
    comparing, by the external controller, the two reception patterns acquired depending on whether jamming is present with each other, thus measuring a null depth, a null width, and a satellite blind ratio of an array antenna system under the jamming situation.

2. The method of claim 1, wherein acquiring the synthetic reception pattern of the adaptive array antenna comprises:
    setting outputs of the wavefront simulator depending on directions of arrival of the jamming signal and the test signals based on the phase differences between outputs of antenna elements respectively calculated for a jamming signal and multiple test signals under the specified jamming situation;
    controlling a signal processing module so that a weight vector under the given jamming situation is obtained, and fixing weight vectors for all of the test signals at the obtained weight vector;
    measuring intensity of a synthetic signal of the signal processing module to which the fixed weight vector is applied; and
    recording the measured intensity of the synthetic signal in a corresponding section of a grid of a two-dimensional (2D) plane, and acquiring the synthetic reception pattern of the adaptive array antenna, wherein the 2D plane is configured by dividing a hemispheric surface into multiple sections of the grid depending on an azimuth angle and an elevation angle around a receiving antenna.

3. The method of claim 1, wherein acquiring the single antenna reception pattern comprises:
    measuring intensity of one of the outputs of the antenna elements selected by the signal processing module in which the adaptive nulling algorithm is deactivated in the non-jamming situation; and
    recording the intensity measured in the non-jamming situation in a corresponding section of a grid of a 2D plane and acquiring the single antenna reception pattern, wherein the 2D plane is configured by dividing a hemispheric surface into multiple sections of the grid depending on an azimuth angle and an elevation angle around a receiving antenna.

4. The method of claim 1, wherein measuring the null depth, the null width, and the satellite blind ratio is configured to measure the null depth as a decrement in signal intensity appearing in a direction of arrival of a jamming signal in the antenna reception pattern in the jamming situation when compared to the antenna reception pattern in the non-jamming situation.

5. The method of claim 1, wherein measuring the null depth, the null width, and the satellite blind ratio is configured to measure the null width as an angle of a beam width corresponding to a gain above a threshold near a null position.

6. The method of claim 1, wherein measuring the null depth, the null width, and the satellite blind ratio is configured to evaluate the satellite blind ratio by calculating an averaged number of Global Navigation Satellite System (GNSS) satellites included in the null width on a hemisphere on which the GNSS satellites are located.

7. The method of claim 1, wherein measuring the null depth, the null width, and the satellite blind ratio is configured to enable evaluation of null depths, null widths, and satellite blind ratios for respective components of the array antenna system.

8. An apparatus for measuring a synthetic reception pattern of an adaptive array antenna, comprising:
    a wavefront simulator for simulating directions of arrival of a jamming signal and test signals using phase differences between outputs of antenna elements depending on an antenna array geometry, and generating multiple signals in which signals corresponding to the phase differences and a GNSS satellite signal are combined;
    an external controller, calculating phase differences between the outputs of the antenna elements depending on the antenna array geometry, and incorporating the phase differences into the wavefront simulator;

a GNSS simulator for generating the GNSS satellite signal;

a signal measurement unit for measuring output intensity of the array antenna system; and a GNSS receiver for checking quality of reception of the GNSS satellite signal, wherein the external controller acquires a synthetic reception pattern of an adaptive array antenna under a specific jamming situation and a single antenna reception pattern in a non-jamming situation while operating in conjunction with the signal measurement unit, compares the two antenna reception patterns with each other, and then measures a null depth, a null width, and a satellite blind ratio of the array antenna system in the jamming situation.

9. The apparatus of claim 8, wherein the wavefront simulator generates an Intermediate Frequency (IF) signal for digital signal processing, as well as a GNSS RF signal.

10. The apparatus of claim 8, wherein the external controller is capable of measuring performance of an entire system including antenna elements, a Radio Frequency (RF) module, and a signal processing module, by incorporating actually measured gains and phases of respective antenna elements of the array antenna into the wavefront simulator.

11. The apparatus of claim 8, wherein the external controller fixes weight vectors for all test signals at a certain weight vector, calculated under the specific jamming situation.

12. The apparatus of claim 8, wherein the external controller causes a signal processing module of the array antenna system in the non-jamming situation to bypass one of the outputs of the antenna elements without applying an adaptive nulling algorithm.

* * * * *